(12) United States Patent
Koduri

(10) Patent No.: US 12,183,703 B2
(45) Date of Patent: Dec. 31, 2024

(54) LEADFRAMES IN SEMICONDUCTOR DEVICES

(71) Applicant: TEXAS INSTRUMENTS INCORPORATED, Dallas, TX (US)

(72) Inventor: Sreenivasan K. Koduri, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/505,494

(22) Filed: Oct. 19, 2021

(65) Prior Publication Data
US 2022/0037277 A1 Feb. 3, 2022

Related U.S. Application Data

(62) Division of application No. 16/150,986, filed on Oct. 3, 2018, now Pat. No. 11,152,322.
(Continued)

(51) Int. Cl.
*H01L 23/00* (2006.01)
*H01L 21/48* (2006.01)
(Continued)

(52) U.S. Cl.
CPC .......... *H01L 24/16* (2013.01); *H01L 21/4828* (2013.01); *H01L 21/565* (2013.01);
(Continued)

(58) Field of Classification Search
CPC ............. H01L 23/495; H01L 23/49541; H01L 23/49548; H01L 23/49558; H01L 23/3121;
(Continued)

(56) References Cited

U.S. PATENT DOCUMENTS 6,150,986 A 11/2000 Sandberg et al.
6,559,527 B2 5/2003 Brofman et al.
(Continued)

FOREIGN PATENT DOCUMENTS

CN 2538067 Y 2/2003
CN 101826514 9/2010
(Continued)

OTHER PUBLICATIONS

Patent Cooperation Treaty Search Report, PCT/US2018/054392, dated Jan. 24, 2019, 3 pages.
(Continued)

*Primary Examiner* — Jasmine J Clark
(74) *Attorney, Agent, or Firm* — Dawn Jos; Frank D. Cimino

(57) ABSTRACT

In one instance, a method of forming a semiconductor package with a leadframe includes cutting, such as with a laser, a first side of a metal strip to a depth D1 according to a cutting pattern to form a first plurality of openings, which may be curvilinear. The method further includes etching the second side of the metal strip to a depth D2 according to a photoresist pattern to form a second plurality of openings. At least some of the first plurality of openings are in fluid communication with at least some of the second plurality of openings to form a plurality of leadframe leads. The depth D1 is shallower than a height H of the metal strip, and the depth D2 is also shallower than the height H. Other embodiments are presented.

20 Claims, 9 Drawing Sheets

Related U.S. Application Data

(60) Provisional application No. 62/568,333, filed on Oct. 5, 2017, provisional application No. 62/568,331, filed on Oct. 5, 2017, provisional application No. 62/568,330, filed on Oct. 5, 2017.

(51) Int. Cl.
  *H01L 21/56* (2006.01)
  *H01L 23/31* (2006.01)
  *H01L 23/495* (2006.01)

(52) U.S. Cl.
  CPC ...... *H01L 23/3114* (2013.01); *H01L 23/3121* (2013.01); *H01L 23/3157* (2013.01); *H01L 23/495* (2013.01); *H01L 23/49541* (2013.01); *H01L 23/49548* (2013.01); *H01L 23/49558* (2013.01); *H01L 23/49586* (2013.01); *H01L 24/13* (2013.01); *H01L 24/17* (2013.01); *H01L 23/4951* (2013.01); *H01L 23/49562* (2013.01); *H01L 24/03* (2013.01); *H01L 24/05* (2013.01); *H01L 24/11* (2013.01); *H01L 24/81* (2013.01); *H01L 2224/0345* (2013.01); *H01L 2224/03452* (2013.01); *H01L 2224/03912* (2013.01); *H01L 2224/0401* (2013.01); *H01L 2224/05147* (2013.01); *H01L 2224/05666* (2013.01); *H01L 2224/1111* (2013.01); *H01L 2224/1147* (2013.01); *H01L 2224/11622* (2013.01); *H01L 2224/13012* (2013.01); *H01L 2224/13013* (2013.01); *H01L 2224/13014* (2013.01); *H01L 2224/13016* (2013.01); *H01L 2224/13082* (2013.01); *H01L 2224/13111* (2013.01); *H01L 2224/13147* (2013.01); *H01L 2224/16055* (2013.01); *H01L 2224/16058* (2013.01); *H01L 2224/16245* (2013.01); *H01L 2224/16501* (2013.01); *H01L 2224/1703* (2013.01); *H01L 2224/17515* (2013.01); *H01L 2224/32245* (2013.01); *H01L 2224/73204* (2013.01); *H01L 2224/81801* (2013.01); *H01L 2224/94* (2013.01); *H01L 2924/01047* (2013.01); *H01L 2924/0105* (2013.01); *H01L 2924/014* (2013.01); *H01L 2924/3656* (2013.01)

(58) Field of Classification Search
  CPC ........... H01L 23/3157; H01L 23/49586; H01L 23/4951; H01L 24/16; H01L 24/13; H01L 24/17; H01L 2224/1111; H01L 21/4828; H01L 21/565
  USPC ........................................................ 257/676
  See application file for complete search history.

(56) References Cited

U.S. PATENT DOCUMENTS

| | | |
|---|---|---|
| 6,780,746 B2 | 8/2004 | Kinsman et al. |
| 7,045,893 B1 | 5/2006 | Paek et al. |
| 7,329,957 B2 | 12/2008 | Sakano et al. |
| 7,505,494 B2 | 3/2009 | Park et al. |
| 8,183,088 B2 | 5/2012 | Jeon et al. |
| 8,551,820 B1 | 10/2013 | Foster et al. |
| 8,993,376 B2 | 3/2015 | Camacho et al. |
| 9,219,025 B1 * | 12/2015 | Lee ................ H01L 23/3135 |
| 9,337,154 B2 | 10/2016 | Miao et al. |
| 2001/0015495 A1 | 8/2001 | Brofman et al. |
| 2006/0027933 A1 | 2/2006 | Chen et al. |
| 2007/0132047 A1 | 6/2007 | Kuisma et al. |
| 2008/0224283 A1 | 9/2008 | Pu et al. |
| 2011/0111562 A1 | 5/2011 | San Antonio et al. |
| 2012/0061822 A1 | 3/2012 | Pagaila |
| 2012/0068334 A1 | 3/2012 | Migita et al. |
| 2012/0098120 A1 | 4/2012 | Yu et al. |
| 2012/0223428 A1 | 9/2012 | Pendse |
| 2013/0069225 A1 | 3/2013 | Lin et al. |
| 2013/0134568 A1 | 5/2013 | Tan |
| 2014/0225239 A1 | 8/2014 | Kimura |
| 2015/0001691 A1 | 1/2015 | Higgins, III |
| 2016/0172277 A1 | 6/2016 | Lee et al. |
| 2016/0260656 A1 * | 9/2016 | Hwang ............ H01L 23/49548 |
| 2016/0322322 A1 | 11/2016 | Utsunomiya |
| 2017/0229421 A1 | 8/2017 | Tseng et al. |
| 2017/0317036 A1 | 11/2017 | Myers et al. |
| 2019/0035669 A1 | 1/2019 | Talledo |

FOREIGN PATENT DOCUMENTS

| | | | |
|---|---|---|---|
| CN | 101826514 A | 9/2010 | |
| CN | 102394232 A | 3/2012 | |
| CN | 104282637 A | 1/2015 | |
| CN | 204992803 | 1/2016 | |
| CN | 204992803 U | 1/2016 | |
| CN | 105374787 A | 3/2016 | |
| JP | H0913940 A | 5/1997 | |
| JP | H09139404 A | 5/1997 | |
| JP | 2002368177 A | 12/2002 | |
| JP | 2014179364 A | 9/2014 | |
| JP | 2007157745 A * | 3/2016 | ... H01L 2224/13017 |
| RU | 2035086 C1 | 10/1995 | |
| WO | 199630942 A1 | 10/1996 | |

OTHER PUBLICATIONS

PCT International Search Report for International Application No. PCT/US 2018/054517, dated Jan. 31, 2019, 2 pages.
HotRod QFN Package PCB Attachment, Texas Instruments, Application Report, SLUA715—May 2014, 11 pages.
CN Office Action dated Jan. 28, 2023.
CN Office Action mailed Feb. 8, 2023.
CN Search Report mailed Sep. 2, 2024.

\* cited by examiner

LEADFRAMES IN SEMICONDUCTOR DEVICES

CROSS-REFERENCE TO RELATED APPLICATION

This application is a division of U.S. patent application Ser. No. 16/150,986, filed Oct. 3, 2018 (now U.S. Pat. No. 11,152,322), which claims priority to U.S. Provisional Application Ser. No. 62/568,330, titled, "High Power Density Leadframes," filed Oct. 5, 2017, U.S. Provisional Application Ser. No. 62/568,331, titled, "High Power Density Packages," filed Oct. 5, 2017, and U.S. Provisional Application Ser. No. 62/568,333, titled, "Pre-Molded High Power Density Leadframes," filed Oct. 5, 2017, all of which are incorporated herein for all purposes.

BACKGROUND

This relates generally to semiconductor devices, and more particularly to leadframes in semiconductor devices.

In some types of semiconductor packages, a semiconductor die is directly mounted to a leadframe via a plurality of interconnect bumps, or posts. The plurality of interconnect bumps electrically connects the semiconductor die to the leadframe. Each interconnect bump's contact surface area at the semiconductor die is often the same size as the interconnect bump's contact surface area at the leadframe.

SUMMARY

In one example, a method for forming a semiconductor package includes forming a leadframe for the semiconductor package and wherein forming the leadframe includes cutting a first side of a metal strip to a depth D1 according to a cutting pattern to form a first plurality of openings extending on the first side. The depth D1 is shallower than a height H of the metal strip. The depth D1 being from the first side toward a second side, which opposes the first side, of the metal strip. The method of forming the lead frame further includes etching the second side of the metal strip to a depth D2 according to a photoresist pattern to form a second plurality of openings extending on the second side and wherein the depth D2 is shallower than the height H of the metal strip. At least some of the first plurality of openings are over the second plurality of openings and are in fluid communication with at least some of the second plurality of openings to form a plurality of leads on the leadframe. The cutting pattern for cutting the first side includes non-linear portions.

The method for forming a semiconductor package further includes coupling a plurality of bumps between a semiconductor die and a plurality of bump landing sites on the plurality of leads of the leadframe. At least some of the plurality of bumps appear to overlap when viewed from an end along at last one of the plurality of leads. The method for forming a semiconductor package also includes covering at least a portion of the semiconductor die and at least a portion of the leadframe with a molding compound to form the semiconductor package.

According to another example, a method for forming a semiconductor package includes forming a leadframe for the semiconductor package. The step of forming the leadframe includes cutting a first side of a metal strip according to a cutting pattern to form a first plurality of openings extending into the first side. The metal strip has the first side and a second side. The second side opposes the first side, and the metal strip has a height H between the first side and the second side. The forming of the leadframe further includes applying a photoresist on the second side of the metal strip, applying a chemical etch to the second side of the metal strip according to a photoresist pattern to form a second plurality of openings extending into the second side of the metal strip, and wherein the at least a portion of the second plurality of openings align with the first plurality of openings. A depth D2 is formed by etching from the second side and is less than the height H of the metal strip.

The forming of the leadframe also includes removing the photoresist from the second side of the metal strip. The cutting of the first side of the metal strip involves forming a plurality of leads having a plurality of bump landing sites, which are sites to receive a base of a corresponding bump. The method also includes coupling a plurality of bumps between a semiconductor die and the plurality of bump landing sites on the leadframe. At least some of the plurality of bumps appear to overlap when viewed from an end along at least some of the plurality of leads. The method also involves covering at least a portion of the semiconductor die and the leadframe with a molding compound to form the semiconductor package.

According to another an example, a semiconductor package includes a metal leadframe that includes: a metal strip having a first side and a second side, wherein the second side opposes the first side; and a first plurality of openings extending partially into the metal strip from the first side and extending along the first side, each of the first plurality of openings has a lateral width W1 that is 50 microns or less. The metal leadframe further includes a second plurality of openings extending partially into the metal strip from the second side and extending along the second side, each of the second plurality of openings has a lateral width W2 that is greater than the lateral width W1. The first plurality of openings intersects the second plurality of openings to form a plurality of leads. The first plurality of openings is non-linear and is over the second plurality of openings. The metal leadframe also includes plurality of bump landing sites on the first side of the leadframe on the plurality of leads.

The semiconductor package further includes a plurality of power bumps having a width W3 and extending from at least some of the plurality of bump landing sites on the leadframe to sites on a semiconductor die; a plurality of signal bumps having a width W4 and extending from at least some of the plurality of bump landing sites on the leadframe to sites on the semiconductor die, and wherein W3 is greater than W4; wherein at least some of the plurality of power bumps and at least some of the plurality of signal bumps appear to overlap when viewed from an end along at least one of the plurality of leads; and a molding compound covering at least portion of the leadframe and at least a portion of the semiconductor die.

According to still another example, a semiconductor package includes a lead frame including a first side and a second side opposite to the first side; and a first plurality of openings from the first side and a second plurality of openings from the second side. Each of the second plurality of openings is wider than each of the first plurality of openings, and each of the first plurality of openings is nonlinear when viewed from a top view of the lead frame. The semiconductor package also includes semiconductor die electrically connected to the lead frame via a plurality of first bumps and a plurality of second bumps. Each of the plurality of first bumps includes an area larger than an area of each of the second plurality of bumps on a given plane of the semiconductor package. At least one of the first plurality of bumps overlap with at least one of the second plurality of bumps from a side view of the semiconductor package. Other examples and arrangements are disclosed herein.

DETAILED DESCRIPTION

Figure 1:
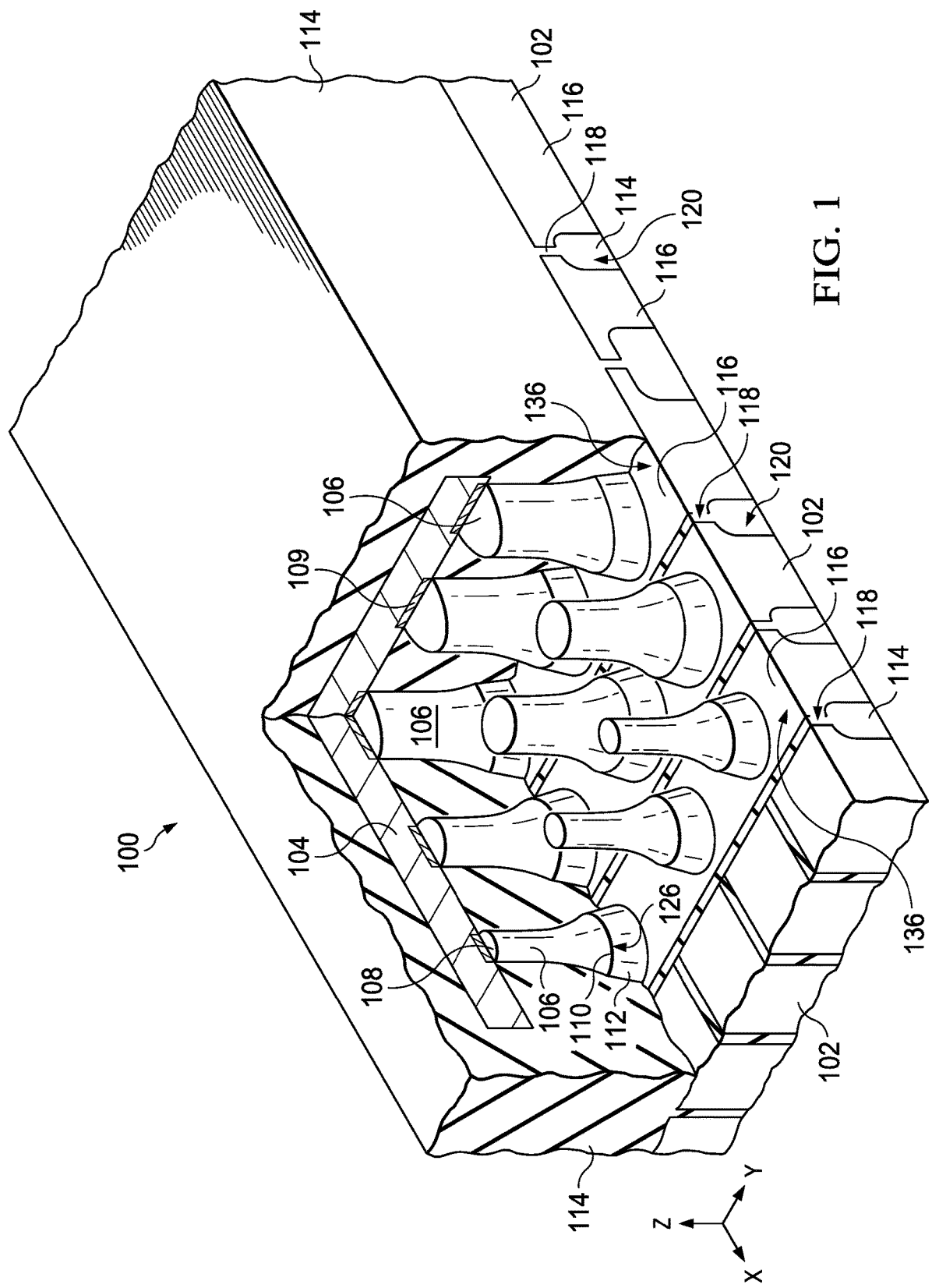
FIG. 1 is a schematic, partial-cut, perspective view of an illustrative semiconductor package.

Some semiconductor packages are configured such that a semiconductor die is directly mounted to a leadframe via a plurality of interconnect bumps, pillars or posts. This type of packaging may provide improved electrical and thermal performance over other types of leaded packages that use wire bonding. Moreover, by eliminating the wire bonds that connect the semiconductor die to the leadframe, the package parasitic can be reduced.

However, semiconductor dies generally have a smaller available surface area for connecting to the interconnect bumps as compared to leadframes. And with the increased proliferation and functionality of electronics, it is desirable to further reduce the size of the semiconductor die. Consequently, as semiconductor dies shrink, the amount of surface area available for interconnect bump connections also shrinks. The surface area available on the semiconductor die for interconnect bump connections is one of the factors that determines the diameter size of the interconnect bump and the number of interconnect bumps that can be used to connect the semiconductor die to the leadframe.

The interconnect bumps have had a uniform, cylindrical shape, e.g., the diameter of the interconnect bump is uniform between the interconnect bump's die side and leadframe side. Thus, the interconnect bumps contact surface area at its die-connection side is the same as its contact surface area at its leadframe-connection side. Reducing the diameter of the interconnect bumps, reduces the interconnect bump's contact surface area not only on the semiconductor die but also the leadframe.

A reduction in the interconnect bump's contact surface area on the leadframe tends to causes the power and current density to increase at the junction between the interconnect bump and the leadframe. Increasing the power and current densities may result in higher temperatures and premature failures due to electromigration at the junction between the interconnect bump and the leadframe. Solder materials used to attach the interconnect bumps to the leadframe may contribute to electromigration issues due to the properties of the solder material used in attaching the interconnect bumps to the leadframe.

Reduction of the interconnect bumps contact surface area on the leadframe, however, is not the only possible issue. With increases in power and current transfers between the semiconductor die and the leadframe, a more substantial—or thicker—leadframe may be needed to handle the increase in power and current transfer. In other words, the leadframe may need to be thicker between the die-connecting side and the PCB-connecting side. Due to manufacturing limitations, a thicker leadframe tends to lead to larger spaces (lateral width) between adjacent leadframe leads. Larger spaces or openings between the leadframe leads reduces the available surface area on the leadframe for interconnect bump contact, which also contributes to an increase in power and current densities at the junction between the interconnect bump and the leadframe. Reducing the spacing between the leadframe leads or developing patterned leads may increase the available surface area on the leadframe for bump connection.

Referring now to the figures and initially to FIG. 1, a schematic, partial-cut, perspective view of a semiconductor package 100, according to some aspects, is presented. The semiconductor package 100 includes a leadframe 102, a semiconductor die 104, and a plurality of bumps 106 that electrically connect sites on the semiconductor die 104 to the leadframe 102. The plurality of bumps 106 includes a first end 108 connected to sites on the semiconductor die 104 and an opposing, second end 110 connected to the leadframe 102. The first end 108 is coupled to a plurality of copper over anything (COA) elements 109. The leadframe 102 includes a plurality of leadframe leads 116 for receiving the second end 110 of the plurality of bumps 106.

The plurality of leadframes leads 116 or lead strips are physically separated from each other and are separated using a first plurality of openings 118 and a second plurality of openings 120. The first plurality of openings 118 is sized to increase the available area on the leadframe leads 116 for receiving the plurality of bumps 106. The available area on the leadframe leads 116 are referred to as landing areas or strips or landing sites 136; this is an area on the leadframe leads for receiving the end of the bump. Aspects of the leadframe 104 will be discussed in more detail below.

The semiconductor package 100 includes a solder material 112 positioned between the second end 11 of the plurality of bumps 106 and the leadframe 102. The solder material 112 is used to attach the second end 110 of the plurality of bumps 106 to the leadframe 102. In some aspects, the solder material 112 is formed of a tin-silver (SnAg) alloy. Other types of solders are used at times, such as SnPb, Sn, SnAgCu, or other alloys of Sn or Bi, to name some.

A solder-bump interface 126 is formed between the second end 110 of the plurality of bumps 106, which may be power or signal bumps or other connective bumps, and the solder material 116. The solder-bump interface 126 may be subject to electromigration problems, including void propagation. Increased current densities can contribute to breakdown of the solder-bump interface 126, which can create reliability issues and prevent the placing of some types of active circuits in the semiconductor die 104 adjacent to the plurality of bumps 106. In some aspects, by increasing the available surface area on the leadframe 102 for receiving the plurality of bumps 106 on landing sites 136, the current densities flowing through the solder-bump interface 126 may be decreased, thereby increasing the life of the solder-bump interface 126 and the semiconductor die 104.

Still referring primarily to FIG. 1, in some aspects, the semiconductor package 100 further includes a molding compound 114 to protect the components in the semiconductor package 100. The molding compound 114 provides structural support to the semiconductor package 100 and covers at least a portion of the leadframe 102, the semiconductor die 104, the plurality of bumps 106 or any combination thereof. In some aspects, the molding compound 114 further fills in the gaps between components of the semiconductor package 100, such as, for example, between the plurality of bumps 106 or between the leadframe leads 116. In yet some aspects, the molding compound 114 is an epoxy, polymer or other insulating material. The molding compound 114 is generally added after the semiconductor die 104 and leadframe 102 have been assembled together.

Figure 2A:
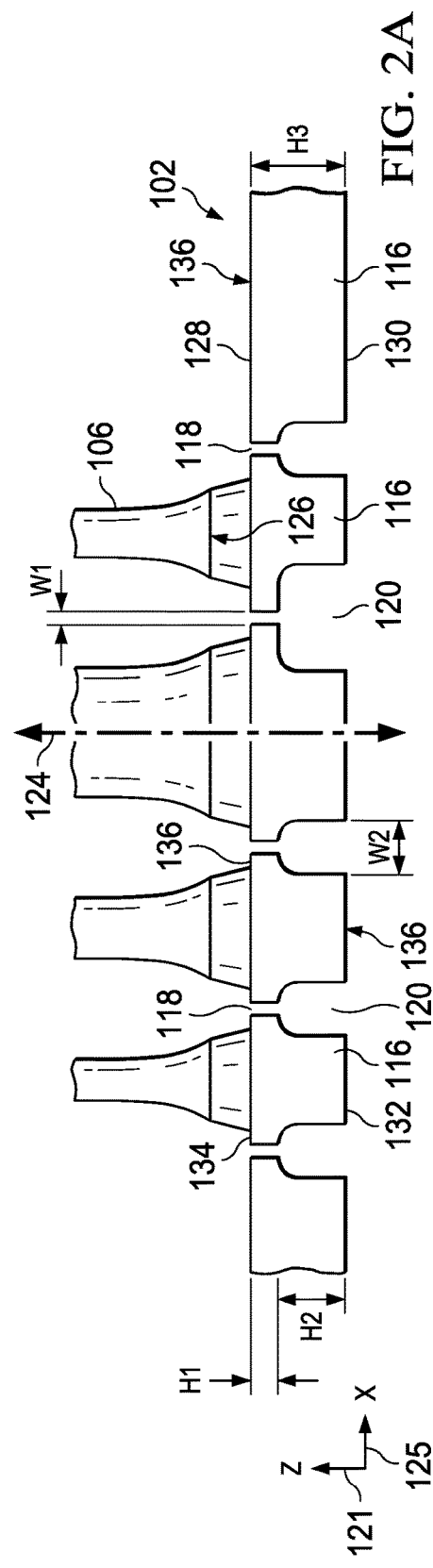
FIG. 2A is a schematic, front view in elevation of a portion of the semiconductor package of FIG. 1.
Figure 2B:
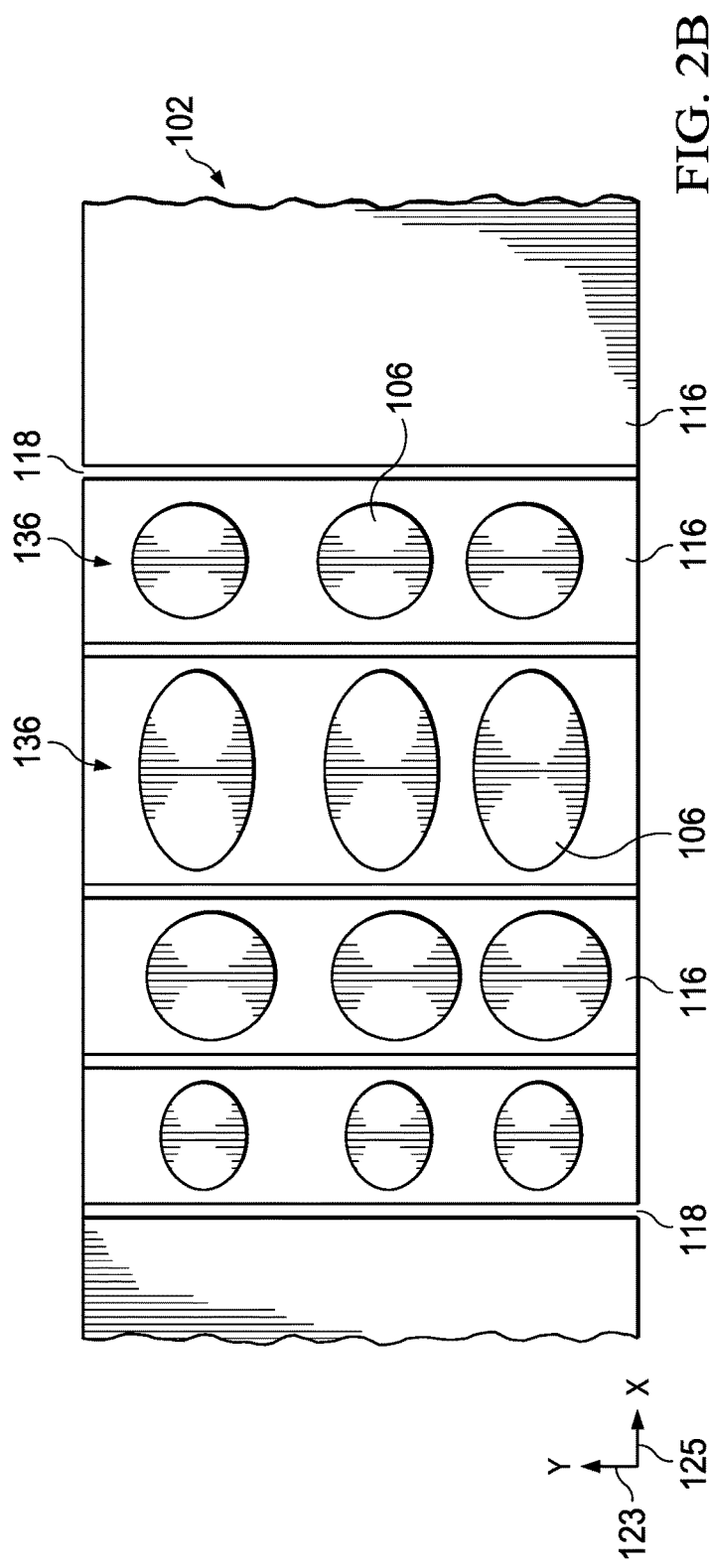
FIG. 2B is a schematic, top view of the semiconductor package of FIG. 2A.

Referring now primarily to FIGS. 2A-2B, with continued reference to FIG. 1, a portion of the semiconductor package 100 is presented. FIG. 2A represents a schematic front view in elevation, and FIG. 2B represents a schematic, top view of the plurality of bumps 106 on the leadframe 102. The leadframe 102 includes a first side 128 and an opposing, second side 130, with the plurality of bumps 106 connected to the first side 128. The leadframe 102 has a height H extending between the first side 128 and the second side 130. In some aspects, H3 depends on the intended package outline. In one example, discrete semiconductor packages that have a single silicon die performing one function tend to have a lead frame thicknesses on the order of 0.38-0.64 mm and packages with multi-function integrated circuits may be in the range of 0.127 mm-0.26 mm, but those skilled in the art will appreciate the various thicknesses may be used with different applications and these are only some examples.

The leadframe 102 includes the first plurality of openings 118 that extends partially into the leadframe 102 from the first side 128 and includes the second plurality of openings 120 that extends partially into the leadframe 102 from the second side 130. Both the first plurality of openings 118 and the second plurality of openings 120 extend into the leadframe 102 in a vertical direction for the orientation shown, e.g., parallel to the z-axis 121. In some aspects, the first plurality of openings 118 and the second plurality of openings 120 are aligned along a vertical axis, e.g., the z-axis 121. The second plurality of openings 120 is wider than the first plurality of openings 118.

In yet some aspects, the first plurality of openings 118 and the second plurality of openings 120 are aligned to intersect and fully separate or isolate portions of the leadframe 102 into, for example, the plurality of leadframe leads 116. Separation of the leadframe 102 occurs along the z-axis 121, the y-axis 123, the x-axis 125 or a combination thereof; there is space formed between portions of the leadframe 102.

There may be instances, however, where full separation of the leadframe 102 is not desired, such that some of the first plurality of openings 118 or some of the second plurality of openings 120 are not fully aligned. Likewise, there may be some instances where one of the second plurality of openings 120 is needed in a position that is not fully aligned with one of the first plurality of openings 118 or vice versa. In some aspects, the first plurality of openings 118 and the second plurality of openings 120 are linearly arranged. In other aspects, the first plurality of openings 118 are nonlinear or otherwise have a curvature or non-linear pattern, see, e.g., FIG. 4. The first plurality of openings 118 is formed according to a cutting pattern 146 (see, e.g., FIG. 3E and FIG. 4). The openings 118, 120 allow for different patterns as will be explained further below.

The first plurality of openings 118 has a lateral width W1 (width of the cut) and are formed using a laser, jet, or other techniques as described further below. In some aspects, the width W1 of the first plurality of openings 118 is less than approximately 75 micrometers. In yet some aspects, the width W1 of the first plurality of openings 118 is approximately 50 micrometers and still in another example 25 micrometers. In contrast, it should be appreciated that other techniques using etching only create a width in most circumstances of no less than 125 micrometers. As previously mentioned, the first plurality of openings 118 extend partially into the leadframe 102 from the first side 128. Thus, the width W1 of the first plurality of openings 118 impacts the surface area on the first side 128 leadframe 102 available for connection with the plurality of bumps 106. By making smaller widths, W1, a technical advantage of having more surface area for bumps 106 is realized. In some aspects, the width W1 of each of the first plurality of openings 118 differs in size. In an example, one of the first plurality of openings 118 has a width of approximately 25 micrometers and another of the first plurality of openings 118 has a width of approximately 35 micrometers.

The second plurality of openings 120 has a lateral width W2 that is greater than W1. In some aspects, the width W2 of the second plurality of openings 120 is greater than approximately 125 micrometers. In yet some aspects, the width W2 of the second plurality of openings 120 is 200 micrometers or greater. The width W2 of each of the second plurality of openings 120 differ in size at times. In some aspects, the width W2 of each of the second plurality of openings 120 depends at times on the printed circuit board (PCB) specifications. In one example, one of the second plurality of openings 120 has a width of approximately 125 micrometers and another of the second plurality of openings 120 has a width of approximately 200 micrometers. In this example, the width W2 of the second plurality of openings 120 is greater than the width W1 of the first plurality of openings 118. In one aspect, the average lateral width W1 of the first plurality openings 118 is greater than the average lateral width W2 of the second plurality of openings 120.

The first plurality of openings 118 has a height H1 (FIG. 2A), or depth D1, measured from the first side 128, and the second plurality of openings 120 has a height H2, or depth D2, measured from the second side 130. The height H1 of the first plurality of openings 118 and the height H2 of the second plurality of openings 120 will equal the height H of the leadframe 102. In some aspects, the height H2 of the second plurality of openings 120 is approximately 50 to 80 percent of the height H of the leadframe 102. In one example, the height H of the leadframe 102 is approximately 200 micrometers, the height H1 of the first plurality of openings 118 is approximately 50 micrometers, and the height H2 of the second plurality of openings 120 is approximately 150 micrometers. In some aspects, the height H1 of the first plurality of openings 118 is approximately 75 micrometers or less.

Referring still primarily to FIGS. 1-2B, and with particular reference to FIG. 2A, the leadframe 102 includes the plurality of leadframe leads 116, with the leadframe leads 116 having a full body portion 132 and a cantilevered portion 134 that extends laterally from the full body portion 132. With respect to the z direction 121, the full body portion 132 extends between the first side 128 and the second side 130 of the leadframe 102. The cantilevered portion 134 extends laterally from the full body portion 132 on the first side 128 of the leadframe 102, which creates a larger surface area on the first side 128 of the leadframe 102 for receiving the plurality of bumps 106.

The cantilevered portion 134 has a thickness or depth that is substantially the same as the height H1 of the first plurality of openings 118. It should be appreciated, however, that due to manufacturing techniques, sections of the cantilevered portion 134 closest to the full body portion 132 at times have a slightly greater height or thickness than the height H1 of the first plurality of openings 118. The thickness of the cantilevered portion 134 should be great enough to support the plurality of bumps 106 and prevent fusing of adjacent cantilevered portions during power transfer between the plurality of bumps 106 and the plurality of leads 116.

The plurality of leadframe leads 116 includes landing areas, sites, or strips 136 on the first side 128 of the leadframe 102 between members of the first plurality of openings 118. The landing areas 136 extends over the cantilevered portions 134 of the leadframe leads 116, thereby increasing the surface area. The landing area on strip 136 provides a location for the second end 110 of the respective bump 106 (with concomitant solder 112) to attach; that is, the landing area provides a place for the base of a corresponding bump.

Still referring primarily to FIGS. 1-2B, the plurality of interconnect bumps 106 extend between the semiconductor die 104 and the leadframe 102 parallel to a longitudinal axis 124 in the z-direction 121. The plurality of interconnect bumps 106 is also be referred to as pillars or bumps. In some aspects, each of the plurality of interconnect bumps 106 has a nonlinear shape along the longitudinal axis 124. The first end 108 of the plurality of interconnect bumps 106 has have a width or diameter that is less than a width or a diameter of the second end 110. Likewise, the first end 108 of the plurality of interconnect bumps 106 has a lateral surface area (perpendicular to longitudinal axis) that is less than a lateral surface area of the second end 110 of the plurality of interconnect bumps 106.

In some aspects, each of the plurality of interconnect bumps 106 is tapered from the second end 110 (lead side) to the first end 108 (die side), such that each of the plurality of interconnect bumps 106 decreases in width from the second end 110 towards the first end 108. In some aspects, the surface area (lateral end) of the second end 110 of each of the plurality of interconnect bumps 106 is greater than the size of the surface area (lateral end) of the first end 108 by a factor of 1 to 3 or more. In yet some aspects, the surface area of the second end 110 is approximately 2 times the size of the surface area of the first end 108. The ratio between the surface area of the second end 110 and the surface area of the first end 108 is at times modified based on the available surface area and components on the semiconductor die 104 and the available surface area, e.g., the bump landing site area 136 on the leadframe 102 for interconnect bump connections.

In some aspects, each of the plurality of interconnects bumps 106 has a truncated-cone or frustum shape along or parallel to the longitudinal axis 124 with a circular cross-sectional shape or other curvilinear shape transverse to the longitudinal axis 124 although other geometric shapes might be used such as squares (see FIG. 9), triangles, polygons, oval (see FIG. 4C), or others. In yet some aspects, the plurality of interconnect bumps 106 has a nonlinear shape along the longitudinal axis 124 with an oval cross-sectional shape transverse to the longitudinal axis 124. The plurality of interconnect bumps 106 may take a number of nonlinear shapes along the longitudinal axis 124 but typically is such that a surface area of the second end 110 is different than the surface area of the first end 108.

In some aspects, shaping the plurality of bumps 106 to allow the second end 110 of the plurality of bumps 106 to be larger (vis-à-vis lateral end surface area) than the first end 108 of the plurality of bumps 106 allows the first end 108 to be small enough to fit on landing sites on the semiconductor die 104, while allowing the second end 110 to take advantage of the larger surface area available on the plurality of leadframe leads 116. The landing areas 136 are in some instances further increased by reducing the spacing (e.g., the width W1 of the first plurality of openings 118) between the leadframe leads 116 to allow for an even larger second end 110 of the plurality of bumps 106 to connect to the leadframe leads 116. This is a technical advantage. Moreover, enlarging the available surface area on the plurality of leads 116 not only allows for the second end 110 of the plurality of bumps 106 to be larger, but the number of the plurality of bumps 106 that connected to the leadframe 102 are increased in some instances. All of these aspects, individually or together, may help reduce current and power densities flowing between the second end 110 of the plurality of bumps 106 and the leadframe 102 and decrease thermal inefficiencies. Likewise, increasing the size of the second end 110 of the plurality of bumps 106 may increase the efficiency of the current exchange, which may result in a decrease in heat output at the solder-bump interface 126.

Figure 3A:
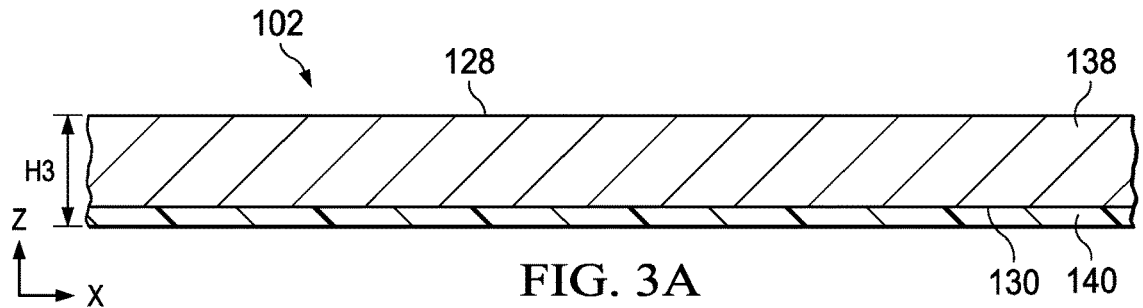
FIGS. 3A-3E are schematic, diagrams showing process steps for forming an illustrative leadframe, which is shown in a cross sectional, elevation view.

FIGS. 3A-3E are schematic, diagrams showing process steps for forming a leadframe, e.g., the leadframe 102 of FIG. 1, according to some aspects. Referring to FIG. 3A, the leadframe 102, which has the first side 128, the opposing second side 130, and the depth or height H therebetween, is formed of a metal sheet, strip, or film 138. The leadframe 102, in some aspects, maintains its height H during these formations steps; thus, the first side 128, the second side 130 and the height H therebetween also applies to the metal strip 138 and will be used to denote the corresponding sides and height of the metal strip 138. In some aspects, the metal strip 138 is formed of copper or a copper alloy. Other suitable metals or materials may be employed. A photoresist 140 is deposited on the second side 130 of the metal strip 138.

Figure 3B:
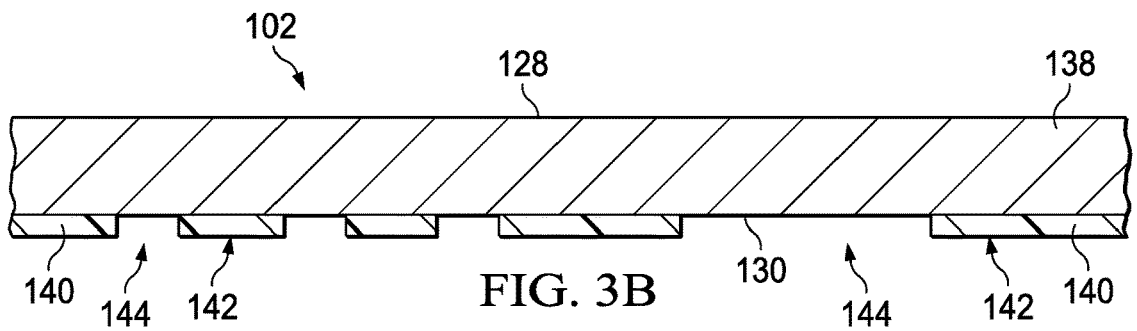
Figure 3C:
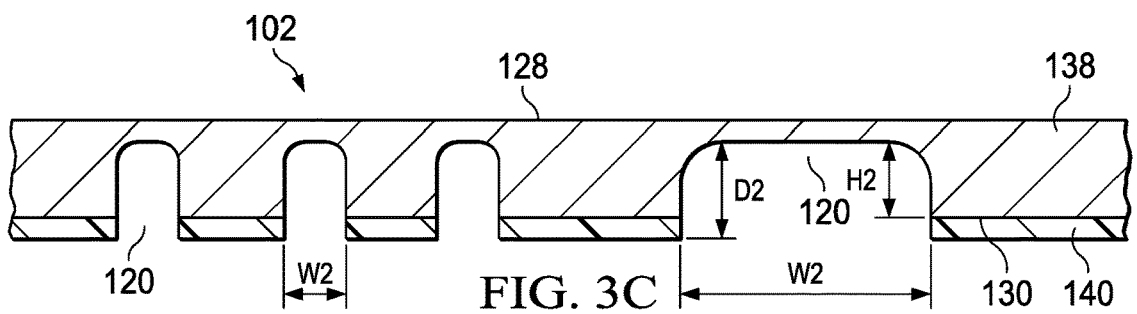

With reference to FIGS. 3B-3C, a mask (not explicitly shown) is placed on the photoresist 140 according to a photoresist pattern 142. The photoresist 140 is exposed to light to form a plurality of openings 144 in the photoresist 140 in accordance with the photoresist pattern 142. A chemical etch is applied to the second side 130 of the metal strip 138 to a depth D2 (FIG. 3C), according to the photoresist pattern 142. The chemical etch forms the second plurality of openings 120 or channels, which has the depth or height H2 from the second side 130.

The depth D2 is shallower than the height H of the leadframe 102. In some aspects, the etch is applied to the second side 130 of the metal strip 138 until 50 to 90 percent of the height H of the leadframe 102 (or the metal strip 138) is removed. In some aspects, the etch is applied to the second side 130 of the metal strip 138 until 80 percent of the height H of the leadframe 102 (or the metal strip 138) is removed. The etching step should leave enough of the metal strip 138 such that the height H1 (FIG. 2A) of the first plurality of openings 118 is thick enough to support the plurality of bumps 106 (shown in FIG. 1) and prevent fusion between adjacent leadframe leads 116.

Each of the second plurality of openings 120 has the lateral width W2 (FIG. 3C). In some examples, some of the second plurality of openings 120 have different widths than others of the plurality of openings 120. For example, the width W2 of one of the second plurality of openings 120 is 200 micrometers or greater and the width W2 of another of the second plurality of openings 120 is approximately 150 micrometers in one instance. The width W2 of each of the second plurality of openings 120 may be based upon printed circuit board (PCB) specifications.

Figure 3D:
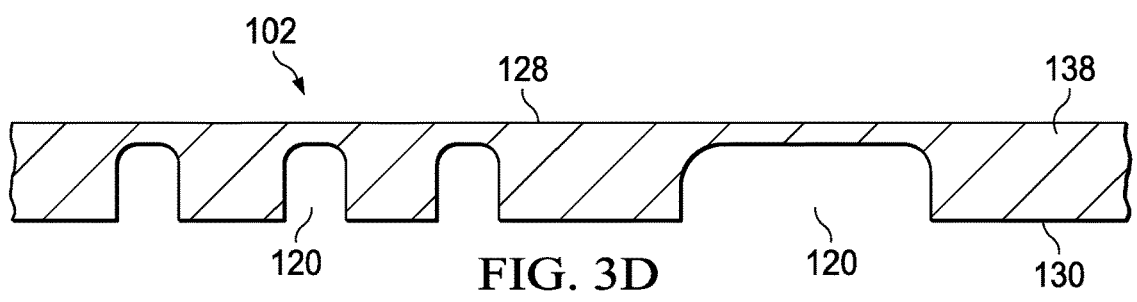

With reference primarily to FIG. 3D, the photoresist 140 is removed. In some aspects, the photoresists 140 may be removed later in the formation process.

Figure 3E:
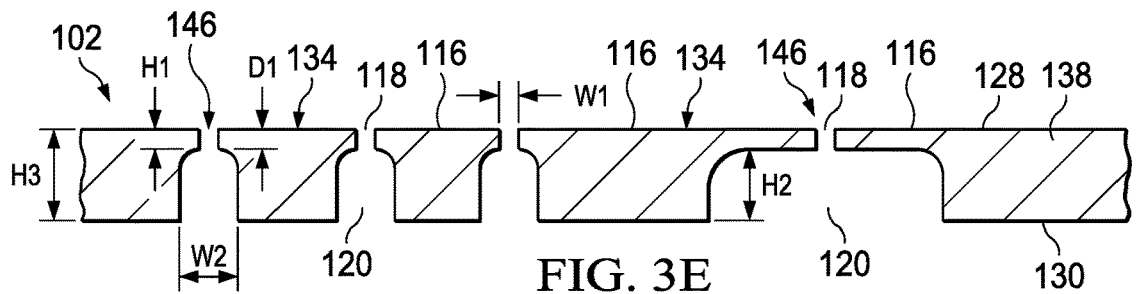

With reference primarily to FIG. 3E, the first side 128 of the metal strip 138 is precision cut to a depth D1, according to the cutting pattern 146. The cut forms the first plurality of openings 118, which has the depth D1 or height H1. The depth D1 is shallower than the height H of the leadframe 102. The depth D1 is sufficient to connect the first plurality of openings 118 with the second plurality of openings 120; this provides a common space and provides isolation to form leads. That is, the first plurality of openings 118 joins with the second plurality of openings 120 in the vertical direction (for the orientation shown) to separate the leadframe 102 into the plurality of leadframe leads 116. At least some of the first plurality of openings 118 are fluidly connected to at least some of the second plurality of openings 120.

In some aspects, the metal strip 138 is cut such that the first plurality of openings 118 has the lateral width W1 that is less than 75 micrometers and in other aspects less than 50 micrometers. In yet some aspects, the metal strip 138 is cut such that the first plurality of openings 118 has the lateral width W1 that is approximately 25 micrometers or less. In some aspects, a laser, a precision water jet, plasma cutter, electrical discharge machining, or mechanical cutting is used to cut the metal strip 138 to form the first plurality of openings 118 therein. In some aspects, a chemical approach is used to form the first openings 118. Other suitable devices may be used that are capable of creating openings less than 50 micrometers wide. Although these devices may be capable of creating wider openings, in some aspects, these cutting devices are capable of creating precise, nonlinear or curved openings according to the cutting pattern 146. Thus, in one instance, the cutting pattern 146 and the first plurality of openings 118 is a customized pattern or shape at least in one of the horizontal directions, e.g., the x-axis or y-axis (shown in FIGS. 1-2B). This provides an advantage in that the pattern allows bigger bumps on the leadframe.

The lateral width W1 between the first plurality of openings 118 and the height H1 of the first plurality of openings 118 is sufficient to prevent fusion between adjacent cantilevered portions 134 during operations. The depth D2 that the second cut, e.g., chemical etch, is applied to the second side 130 of the metal strip 138 is controlled accordingly.

In one aspect, the step of cutting the metal strip 138 to form the first plurality of openings 118 is be performed after the step of etching the metal strip 138 to form the second plurality of openings 120. In some aspects, the cutting pattern 146 and the photoresist pattern 142 are aligned or coordinated. In some aspects, the photoresist pattern 142 is removed after the cutting step. In yet some aspects, the cutting of the first side 128 of the metal strip 138 aligns with locations where at least 50 percent of the height H3 has been etched from the second side 130 of the metal strip 138.

In some aspects, the photoresist pattern 142 is substantially (e.g., majority) linear such that the second plurality of openings 120 is substantially linear. In some aspects, the cutting pattern 146 is also substantially linear such that the first plurality of openings 118 is substantially linear. In other aspects, the cutting pattern 146 is nonlinear, i.e., is curvilinear, such that the first plurality of openings 118 is substantially nonlinear or curved. In some instances, a nonlinear cutting pattern includes straight lead portions connected at angles (see, e.g., FIG. 5).

Figure 4A:
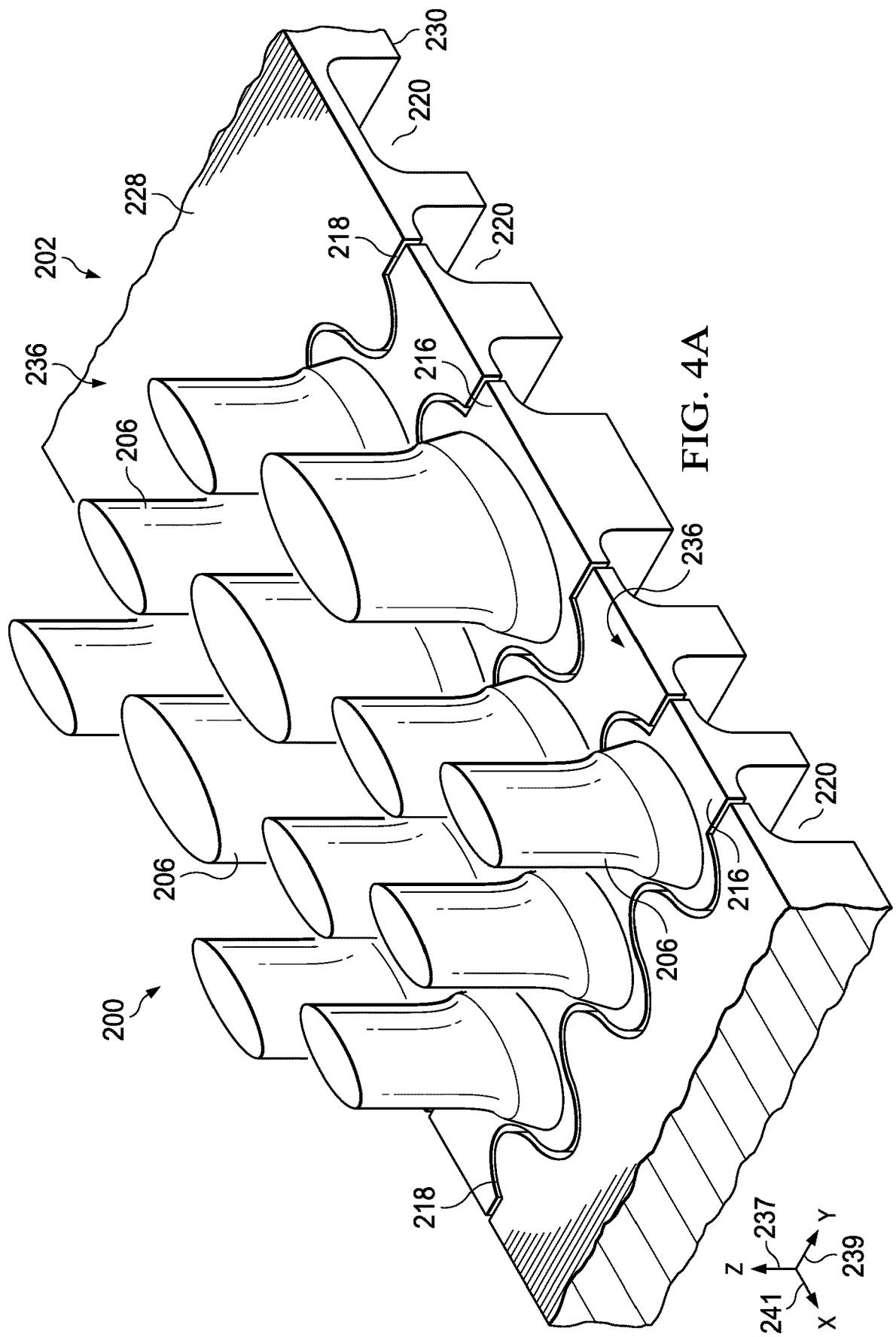
FIG. 4A is a schematic, perspective view of a portion of an illustrative semiconductor package.
Figure 4B:
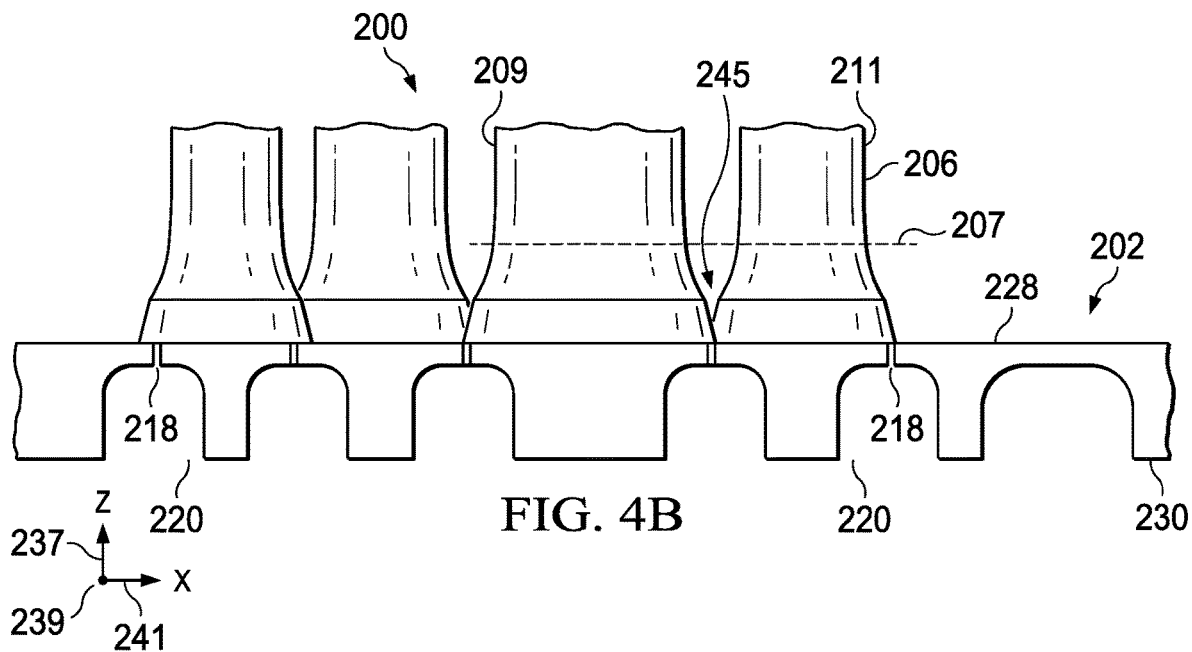
FIG. 4B is a schematic, front view in elevation of the semiconductor package of FIG. 4A.
Figure 4C:
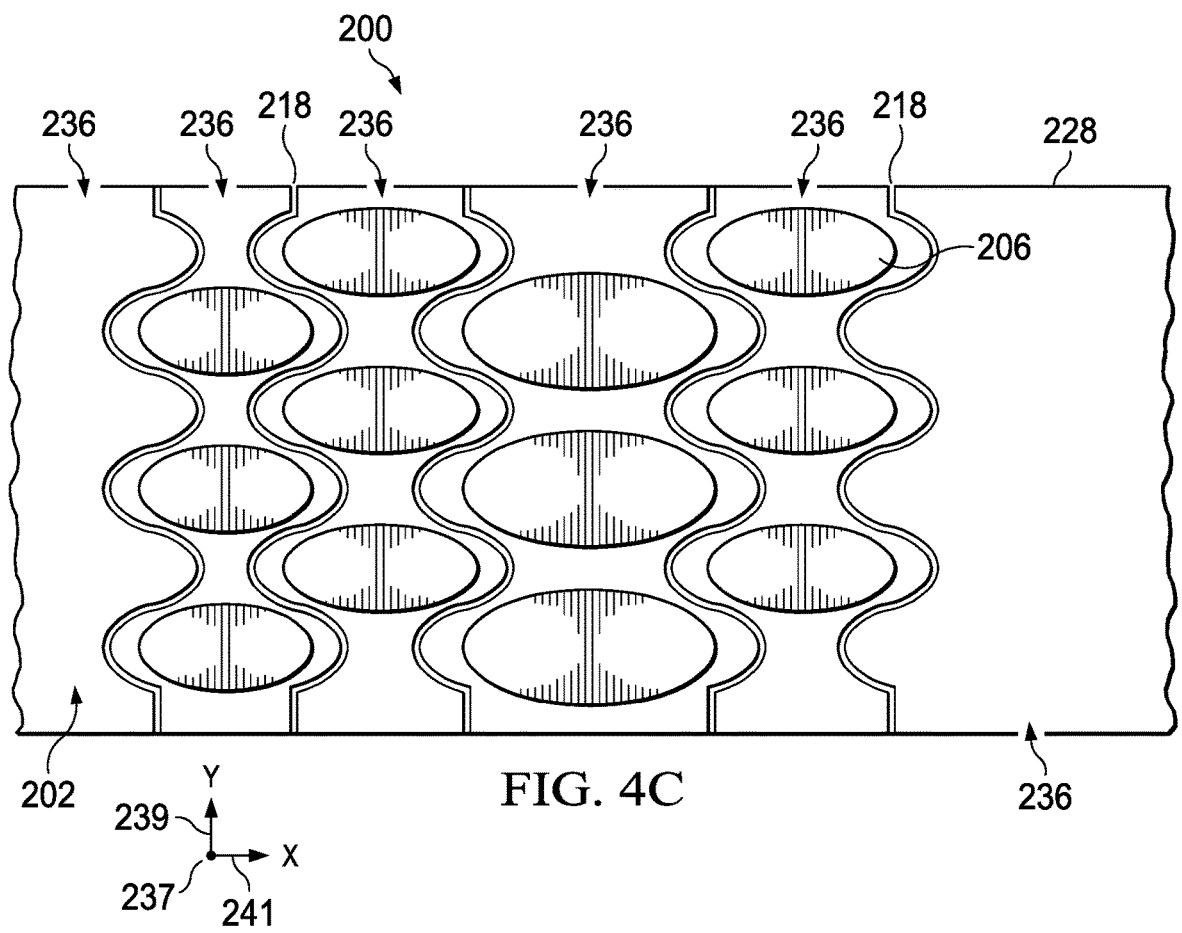
FIG. 4C is a schematic, top view of the semiconductor package of FIG. 4A.
Figure 4D:
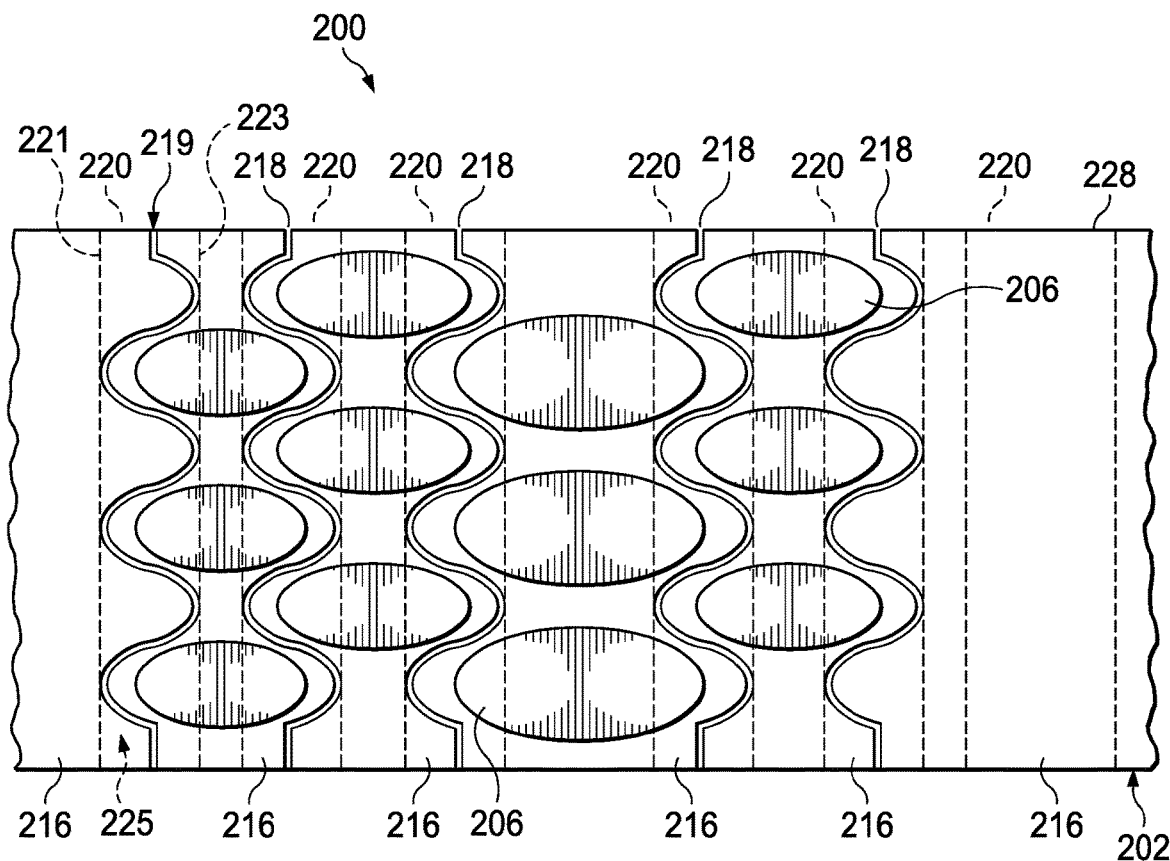
FIG. 4D is a schematic, top view of the semiconductor package of FIG. 4A with openings shown via hidden leads.

Referring now primarily to FIGS. 4A-4D, a portion of a semiconductor package 200 is presented that includes a leadframe 202 with a plurality of interconnect bumps 206 extending therefrom. FIG. 4A represents a schematic, perspective view of the semiconductor package 200. FIG. 4B represents a schematic, front view in elevation of the semiconductor package 200. FIG. 4C represents a schematic, top view of the semiconductor package 200 with the die not shown. FIG. 4D represents another schematic, top view of the semiconductor package 200 without the die and with aspects of the semiconductor package 200 shown via hidden leads.

The leadframe 202 has a first side 228 and an opposing, second side 230. The plurality of interconnect bumps 206 extends from the first side 228 of the leadframe 202 toward a die (see FIG. 1). A first plurality of openings 218 extends into the leadframe 202 from the first side 228, and a second plurality of openings 220 extends into the leadframe 202 from the second side 230 to form a plurality of leads 216. The first plurality of openings 218 and the second plurality of openings 220 are connected such that the leadframe 202 is separated along a vertical axis (for orientation shown), e.g., the z-axis 237. In yet some aspects, first plurality of openings 218 and the second plurality of openings 220 are connected such that the leadframe 202 is separated along a vertical axis and a horizontal axis (for orientation shown), e.g., the z-axis 237 and the y-axis 239 to form a plurality of leads. In some aspects, the first plurality of openings 218 and the second plurality of openings 220 may be referred to as being in fluid communication.

The leadframe 202 differs from the leadframe 102 of FIGS. 1-2B in that the first plurality of openings 218 are nonlinear and have a curvature, sinusoidal, custom, or other nonlinear pattern. In contrast, each of the first plurality of openings 118 illustrated in FIGS. 1-2B is straight or linear along a horizontal axis (for orientation shown), e.g., the y-axis. The first plurality of openings 218 are still aligned with (over the top of) the second plurality of openings 220 such that the leadframe 202 is fully segmented or separated at least along the z-axis 237 to create isolation in some instances. The leadframe 202 is separated into a plurality of leadframe leads 216. The first plurality of openings 218 and the second plurality of openings 220 are formed using techniques described above with regard to FIGS. 3A-3E. Not only do the precision cutting apparatuses described above form smaller and more precise cuts compared to etching techniques, but the cutting apparatuses form the first plurality of openings 218 in custom, nonlinear geometric shapes. This allows for what appears to be overlapping of bumps 206 when viewed from an end (see, e.g., FIG. 4B); this is referred to as being interdigitized, intermeshed, or apparent bump overlap when viewed from an end along one or more leads (end view).

As shown clearly in FIG. 4B, the plurality of interconnect bumps 206 differs from the plurality of interconnect bumps 106 of FIGS. 1-2B in that some of the plurality of interconnect bumps 206 overlap (appear to overlap from certain views) others of the plurality of interconnect bumps 206 along one or more horizontal directions, e.g., the x-axis 241, the y-axis 239 or a combination thereof. The plurality of interconnect bumps 206 is sized or shaped to take advantage of the increased and sometimes unique surface area or bump landing sites 236 on the first side 228 of the leadframe 202. In yet some aspects, some of the plurality of interconnect bumps 206 are larger than others of the plurality of interconnect bumps 206. In some aspects, the size of each of the plurality of interconnect bumps 206 is customized based on what devices in the semiconductor die the plurality of bumps 206 is connecting to as well as the available surface area on the semiconductor die (104, FIG. 1).

With reference primarily to FIG. 4D, the second plurality of openings 220 are shown via hidden lines. The first plurality of openings 218 are over the top of at least a portion of the second plurality of openings 220 with respect to the z-direction 237. In other words, the first plurality of openings 218 is within the boundaries of the second plurality of openings 220, as illustrated by the hidden lines demarking openings 220. As one specific example, a first opening 219 of the first plurality of openings 218 is between a first wall 221 and a second wall 223 of a second opening 225 of the second plurality of openings 220.

Figure 5:
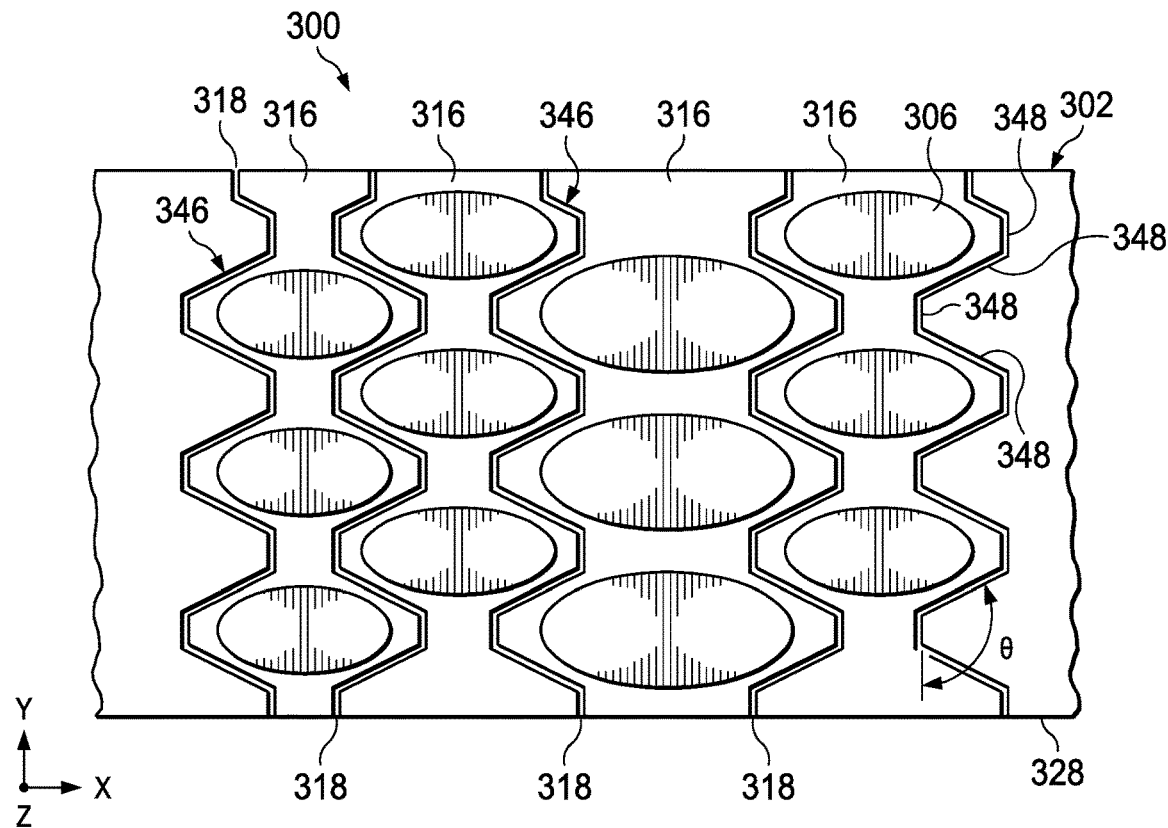
FIG. 5 is a schematic, top view of a portion of an illustrative semiconductor package.

Referring now primarily to FIG. 5, a schematic, top view of a portion of a semiconductor package 300 is presented. The semiconductor package 300 is similar to the semiconductor package 200 illustrated in FIGS. 4A-4D, except for the shape of a cutting pattern 346. The semiconductor package 300 includes a leadframe 302 segmented into a plurality of leadframe leads 316 via at least a first plurality of openings 318 from a first side 328 and the second plurality of openings (analogous to openings 220) from a second, opposing side. The first plurality of openings 318 extends from a first side 328 of the leadframe 302 toward the opposing second side. The second plurality of openings is not shown but would be arranged analogously to the second plurality of openings 220 in FIGS. 4A-4D.

The first plurality of openings 318 is arranged according to the cutting pattern 346. The cutting pattern 346 and, thus, the first plurality of openings 318, is overall nonlinear, e.g., having traces in both x and y directions at places. In some aspects, the first plurality of openings 318 and the cutting pattern 346 include a number of straight segments 348 connected together to form an angle at each segment, for example angle θ. In yet some aspects, the first plurality of openings 318 and the cutting pattern 346 is a modified zigzag pattern that extends generally in the direction of the y-axis. While the cutting pattern 346 of FIG. 5 is formed of a number of straight segments 348, in some instances, the cutting pattern 346 also includes smooth or curved segments having a rounded profile.

Figure 6:
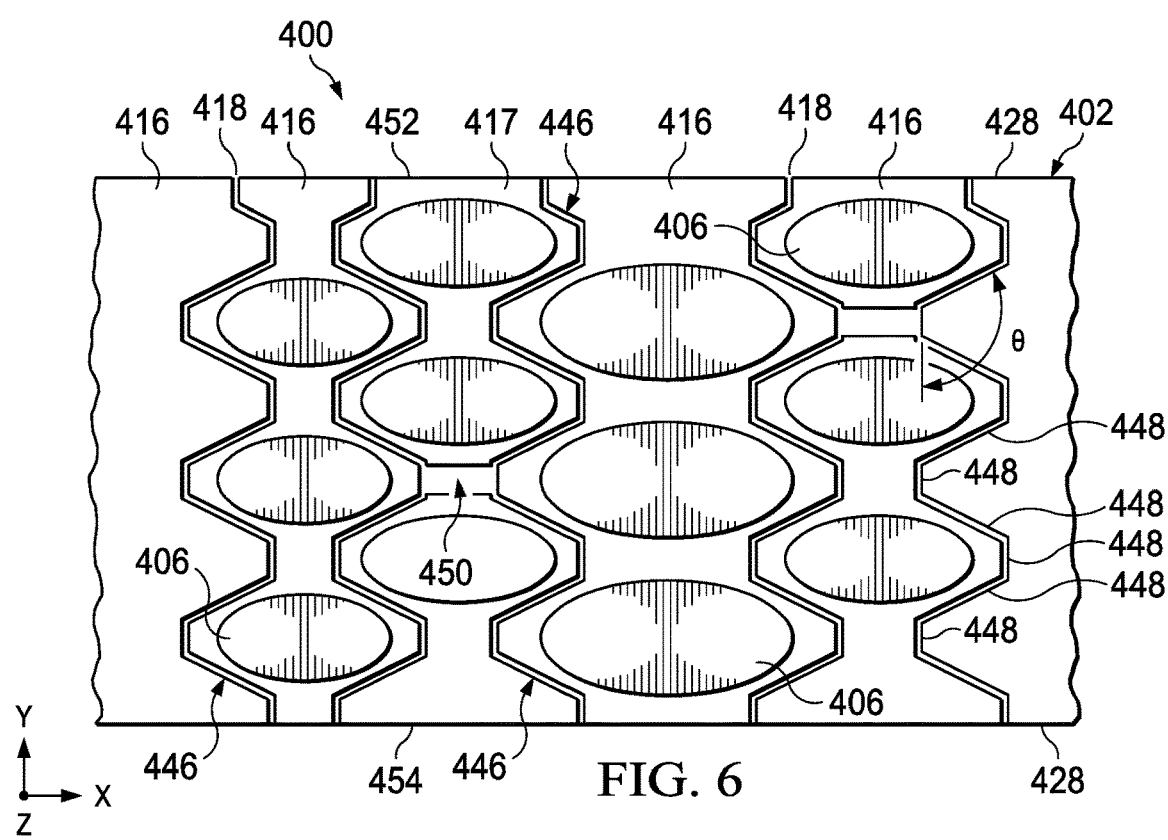
FIG. 6 is a schematic, top view of a portion of an illustrative semiconductor package.

Referring now primarily to FIG. 6, a schematic, top view of a portion of an illustrative semiconductor package 400 is presented. The semiconductor package 400 is similar to the semiconductor package 300 illustrated in FIG. 5, except for the shape of a cutting pattern 446. The semiconductor package 400 includes a leadframe 402 segmented into a plurality of leadframe leads 416 via at least a first plurality of openings 418 from the first side 528 and underlying second plurality of openings from the opposing second side (see, e.g., openings 220). The first plurality of openings 418 extends from a first side 428 of the leadframe 402 toward the opposing second side. The second plurality of openings is not shown but would be arranged analogously to the second plurality of openings 220 in FIGS. 4A-4D.

The first plurality of openings 418 is arranged according to the cutting pattern 446. The cutting pattern 446 and, thus, the first plurality of openings 418 are overall nonlinear along at least one direction, e.g., the y-axis. In some aspects, the first plurality of openings 418 and the cutting pattern 446 include a number of straight segments 448 connected together to form an angle, for example angle θ. In yet some aspects, the first plurality of openings 418 and the cutting pattern 446 form a modified zigzag pattern that extends overall along in a first direction, such as the y-axis.

The first plurality of openings 418 and the cutting pattern 446 include a space or gap 450. The space 450 separates one of the plurality of leadframe leads 417 into a first portion 452 and a second portion 454. The leads include bump landing sites for receiving a plurality of bumps. The space 450 extends through (z-direction) the leadframe 402 such that full separation between the first portion 452 and the second portion 454 is achieved. The spaces 450 are primarily used to electrically separate (isolate) two parts of leadframes. By doing this, one can get more pins or I/O (input/output) functionality.

Figure 7:
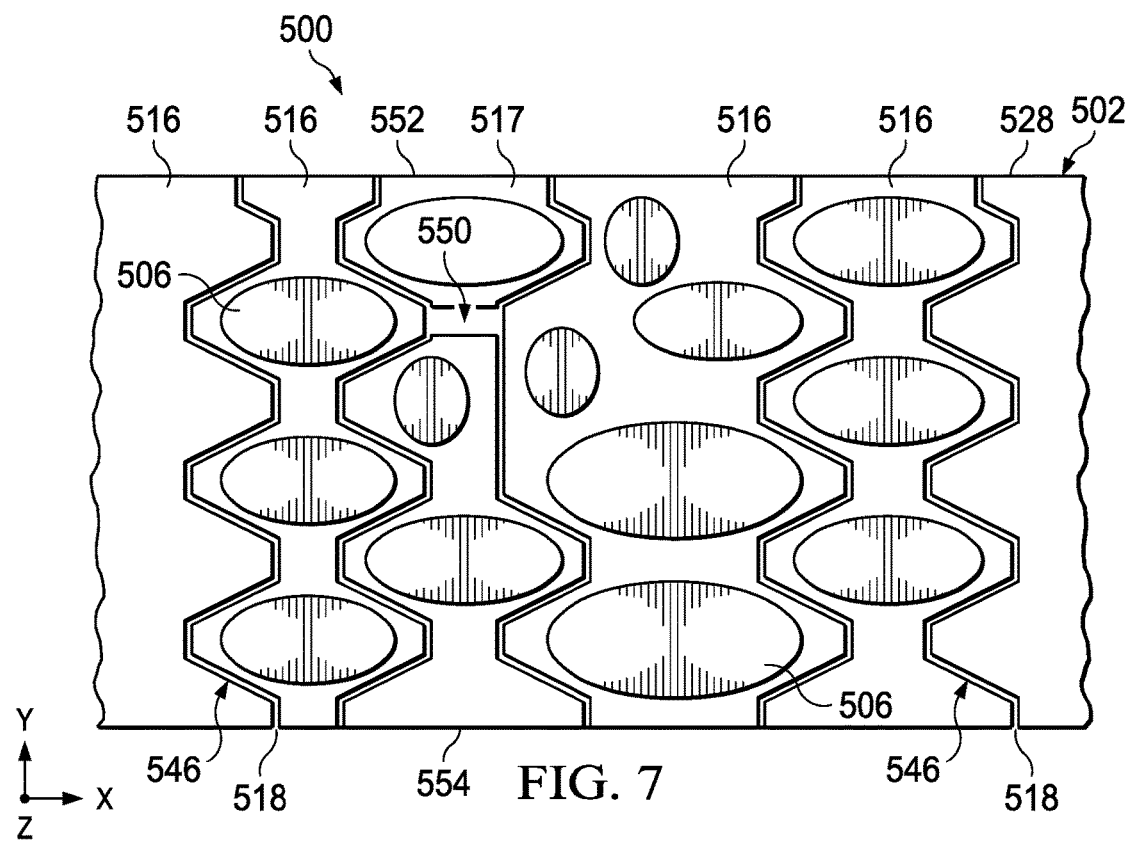
FIG. 7 is a schematic, top view of a portion of an illustrative semiconductor package.

Referring now primarily to FIG. 7, a schematic, top view of a portion of an illustrative semiconductor package 500 is presented. The semiconductor package 500 is similar to the semiconductor package 300 illustrated in FIG. 5 and the semiconductor package 400 illustrated in FIG. 6. The semiconductor package 500 illustrates another aspect of how a cutting pattern 546, a first plurality of openings 518, and a plurality of interconnect bumps 506 are customized into a number of shapes in some instances. The semiconductor package 500 includes a leadframe 502 segmented into a plurality of leadframe leads 516 via at least the first plurality of openings 518 and underlying second plurality of openings (analogous to openings 220). The second plurality of openings is not shown but would be arranged analogously to the second plurality of openings 220 in FIGS. 4A-4D. It should be appreciated that the first plurality of openings 518 would connect to the second plurality of openings as described in previous examples.

The first plurality of openings 518 and the cutting pattern 546 include a space or gap 550. The space 550 separates one of the plurality of leadframe leads 517 into a first portion 552 and a second portion 554. The space 550 extends through (z-axis) the leadframe 502 such that full separation between the first portion 552 and the second portion 554 is achieved. The first plurality of openings 518 and the plurality of bumps 506 are customized at times in size, shape, position, etc. based on PCB and semiconductor die configurations. A variety of bumps 506 with varying widths and shapes are shown.

Figure 8:
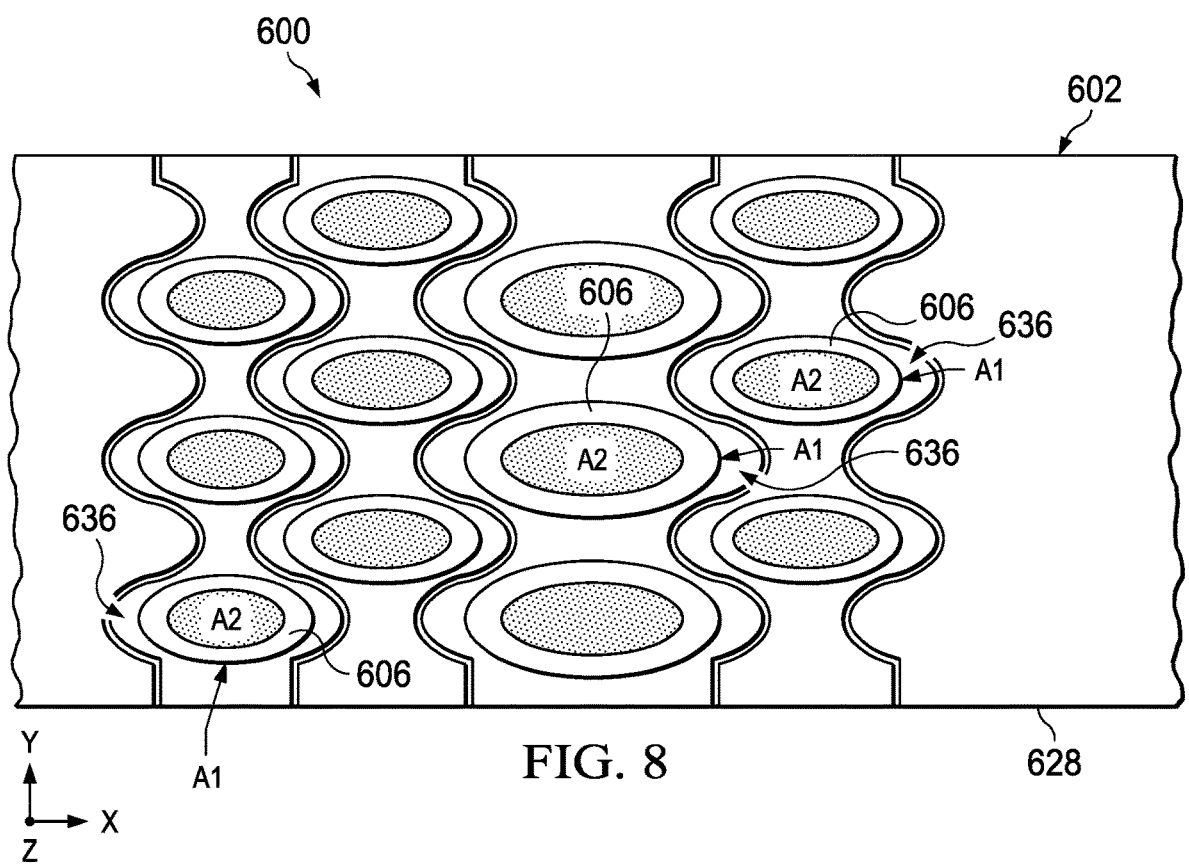
FIG. 8 is a schematic, top view of a portion of an illustrative semiconductor package.

Referring now primarily to FIG. 8, another schematic, top view of a portion of an illustrative semiconductor package 600 is presented. The semiconductor package 600 includes a leadframe 602 and a plurality of interconnect bumps 606 extending therefrom. The semiconductor package 600 illustrates how, in some aspects, creating a nonlinear, first plurality of openings 618 by using a nonlinear cutting pattern 646 increases a bump landing site area 636 on a first side 628 of the leadframe 602 such that a lateral cross sectional surface area A1 (outer ring) of the plurality of interconnect bumps 606 is increased. For reference, a lateral cross sectional surface area A2 is superimposed over the surface area A1 of the plurality of bump 606 to show the variation in surface area between when the first plurality of openings 618 is linear (A2), such as shown in FIGS. 2A-2B, and when curvilinear (A1). Thus, by modifying the first plurality of openings 618 to be nonlinear or otherwise having a curvature, the surface area A1 of the plurality of bump 606 is increased from the surface area A1 to the surface area A2. In some examples, the surface area A2 is twice that of the surface area A1.

Figure 9:
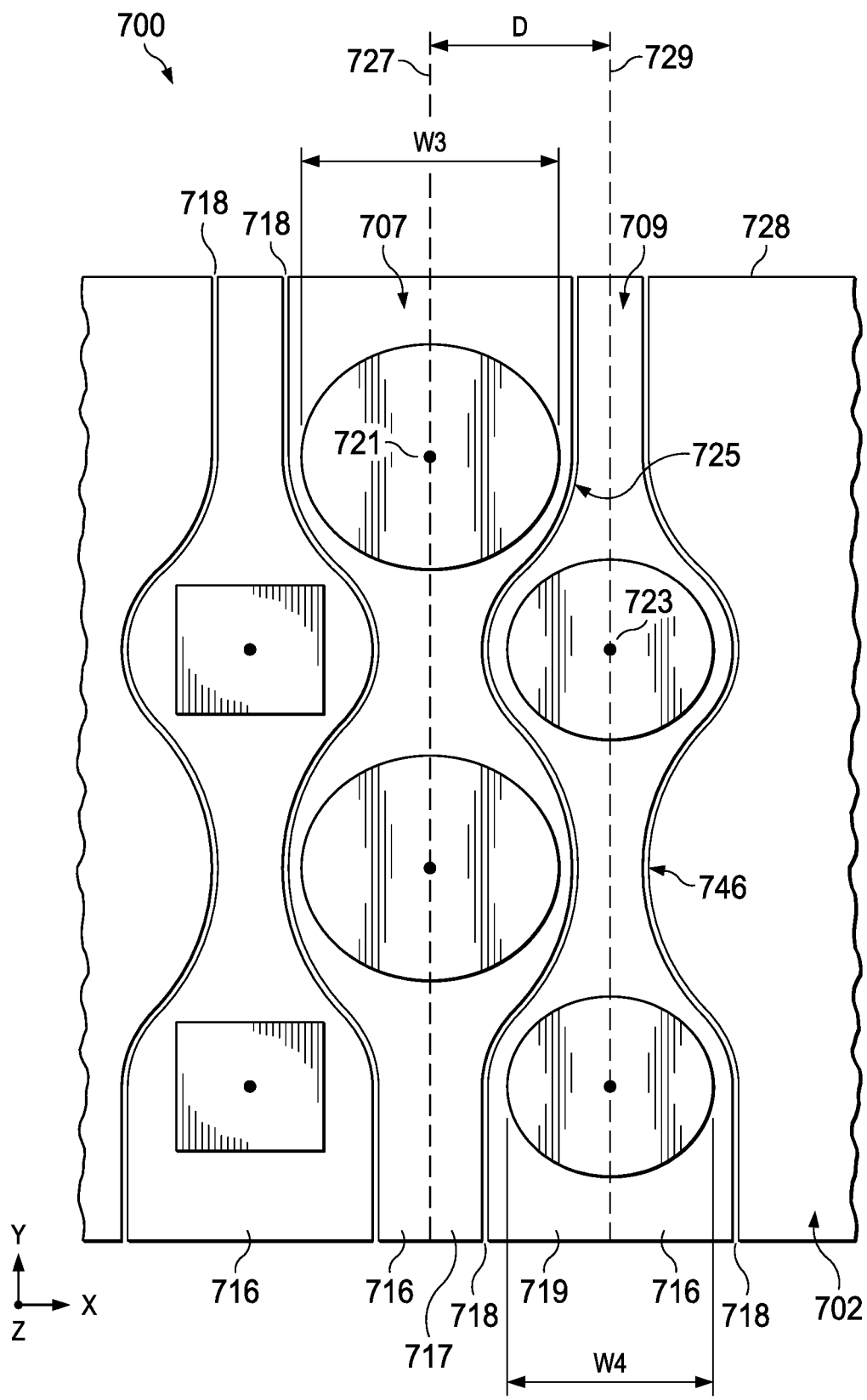
FIG. 9 is a schematic, top view of a portion of an illustrative semiconductor package.

Referring now primarily to FIG. 9, a schematic, top view of a portion of an illustrative semiconductor package 700 is presented. The semiconductor package 700 is similar to the semiconductor package 300 illustrated in FIG. 5 and the semiconductor package 400 illustrated in FIG. 6. The semiconductor package 700 includes a leadframe 702 segmented into a plurality of leadframe leads 716 via at least the first plurality of openings 718 and underlying second plurality of openings (analogous to openings 220). The second plurality of openings is not shown but would be arranged analogously to the second plurality of openings 220 in FIGS. 4A-4D. It should be appreciated that the first plurality of openings 718 would connect to or intersect or be in fluid communication with the second plurality of openings as described in previous examples to form the plurality of leads 716.

The first plurality of openings 718 and the cutting pattern 746 and the plurality of bumps 506 are, in some instances, customized in size, shape, position, etc. based on PCB and semiconductor die configurations.

A plurality of power bumps 707 and a plurality of signal bumps 709 are coupled to the first side 728 and extend between the first side 728 (with solder also on that end; see 112 in FIG. 1) to sites on a die (not explicitly shown but analogous to 104 in FIG. 1). While bumps 707, 709 may vary in size amongst the groups, for explanation of how the density of bumps may be increased, assume that that each of the plurality of power bumps 707 has a width W3, which in this case is a diameter since the bumps 707 have circular cross sections at the first end. It should, be understood, that any shape might be used as previously suggested and, in this regard, a square cross section is shown on the two on the left (for orientation shown). In other examples, other sized bumps are used in a variety of widths depending on the functionality of the bumps.

The plurality of signal bumps 709 may be assumed to have a width W4, which in this example is a diameter. Because they are not carrying power, the signal bumps 709 are smaller in lateral width than the power bumps 707, i.e., W3>W4. Moreover, because the first openings 718 are non-linear, e.g., curved, curvilinear, patterned, sinusoidal, or otherwise shaped, the pattern allows an intermeshing of the power bumps 707 and signal bumps 709; this means if one were to view along the surface of the first side 728 along a lead such as the middle lead 716, the power bumps 707 and signal bumps 709 would appear to overlap (see by analogy the apparent overlap 245 in FIG. 4B).

In one example, at least one of the plurality of power bumps 707 is on a first lead 717 of the plurality of leads 716, which is adjacent to a second lead 719 of the plurality of leads 716. A least one of the plurality of signal bumps 709 is on the second lead 719. A center 721 of the at least one of the plurality of power bumps 707 on the first lead 717 is separated orthogonally from a center 723 of the at least one of the plurality of signal bumps 709 by a distance D. The distance orthogonally separating the bumps means the distance between a longitudinal axis 727 (generally along the lead) of the power bump 707 and the longitudinal axis 729 of the signal bump 709. Half of the width of the power bump 707 and half of the width of the signal bump 709 combined are greater than the distance, D, separating the centers, i.e., $((1/2*W3)+(1/2*W4))>D$. This is possible because the first opening 718 is patterned to go around the power bump 707 and then move inward (toward center as shown) at 725 to go around the signal bump 709 before going outward around the next power bump.

Figure 10:
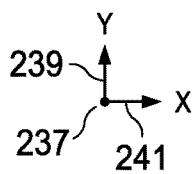
FIG. 10 is an illustrative method of forming a semiconductor package.
Figure 10:
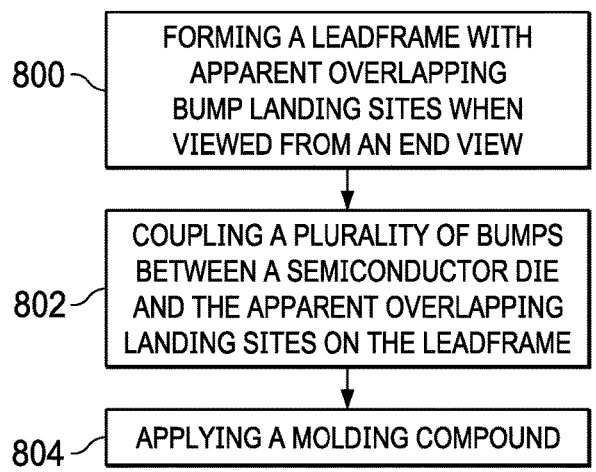

Referring now primarily to FIG. 10, another illustrative example that includes a method for fabricating a semiconductor package offering more landing space on the leadframe is presented. The method includes forming a leadframe of the types presented above and then completing the package. Thus, in step 800, a leadframe (e.g., 102, FIG. 1-3; 202, FIG. 4; 302, FIG. 5; 402, FIG. 6; 502, FIG. 7; 602, FIG. 8) consistent with the examples above is formed. The leadframe has overlapping bump landing sites; that is the bump landing sites or bumps when applied appear to overlap (see 245 in FIG. 4B) when viewed from an end (end view). At step 802, a plurality of bumps are coupled between a semiconductor die (104, FIG. 1) and the bump landing sites on the leadframe. It will be understand that this includes solder 112 (FIG. 1). The method also includes applying a molding compound (e.g., 114, FIG. 1) to cover at least a portion of the leadframe and bumps at step 804.

In one example, a desire to interconnect a semiconductor die to a leadframe while increasing the connection interface on the leadframe and reducing the interconnection area on the die is accomplished. The interconnection is done with a plurality of bumps that have a wide lateral base on the side that interconnects on the leadframe and has a smaller lateral end base at the point of interconnection on the die. While they could take any number of different cross-sections (lateral cross section)—circular, oval, square, triangle, polygon, and the like—the overall longitudinal profile is tapered to go from the larger base to a narrower base. In order to accommodate the larger base on the leadframe side, the bump landing sites are made larger by allowing them to overlap as it appears from looking at it on an end (end view; 245 in FIG. 4B). If one looks at it from a point of reference that is along a top surface—eye adjacent to the surface—of the leadframe, the bumps will appear to intermesh or overlap (see 245 in FIG. 4B). When viewed, however, from the top, one may see that the top openings, which separate the leadframe into different leads, form a pattern that weaves in and out on an x-y plane of the leadframe so that the bases of each bump are in fact separated from one another but appear to overlap from the edge (end view).

Many different patterns might be formed for the first openings that shape the leads such as zigzag, sinusoidal, orthogonal or angled turns. In order to make the pattern, two things are done in one example. A bottom opening or channel or space is formed that is somewhere about 50% to 80% of the otherwise thickness of the leadframe thickness, and then, on top of that—from the top surface—a precise cut is made with a pattern. That precise cut is done with precise equipment such as a laser or water jet or precise mechanical cut. The precise cut can be done with a programmed pattern as one skilled in the art would understand. This precision cut from the top allows the pattern to accommodate the larger bases of the plurality of bumps. In one example, the pattern may initially go straight (parallel to the leads) for a distance and then the non-linear pattern begins. Because the precision cut is made on the top surface over a wider opening that was formed on the bottom surface, the leads are formed and are isolated.

The meaning of terms used herein should be clear from the foregoing, but in addition, the following amplifications are provided. "Bumps," which are also known as posts or pillars, are a type interconnect between a die and leadframe. Example bumps are presented above as 106, 206, 506, 606, 707, and 709. "Bump landing sites" or "landing sites" on the leads are portions on the surface of a lead sized to receive an end or base of a corresponding bump to form a connection. Example bump landing site 136 are shown on at least some of the leads, e.g., areas or strips or landing sites 136. All the top views of the bumps 106, 206, 506, 606, 707, and 709 are on bump landing sites on the leadframe. In one example, the bump landing site is a location on a lead that is intended to receive a bump to form an interconnection. "Chemical etch" is a way of using etching chemicals to remove all or a portion of metal in a selected, unprotected location. "Curvilinear" means formed at least in part with curved boundaries or lines. An example of curvilinear is the curving patterns shown in FIG. 9. "Cutting pattern" means a pattern for a cutting device to trace out a cut; the cutting pattern may be saved in memory.

"First plurality of openings" herein refers to openings made by the precision cut device from a first surface of a metal strip and at least partially over a second plurality of openings to form a combined opening through the metal strip. "Fluid communication" between two portions means that there is an opening between them that allows fluid (e.g., air) to flow between them. If a space on the bottom (for the orientation shown) intersects a space on the top so that are in fluid communication, it means the two spaces form one space that includes both the top and bottom spaces. "Leadframe" is a metal frame that provides external electrical connection to the packaged chip or semiconductor device. Examples from above include 101, 202, 302, 402, 502, 602, and 702. "Leads" of the leadframe are the lengthwise members on which, at least in some examples, bumps may be attached. Examples from above include 116, 216, 316, 416, 516, 517, and 716. "Metal strip" means an alloy, e.g., copper alloy, or metal from which leadframe are formed. An example from above is metal strip 138.

"Molding compounds" are epoxy resins as part of semiconductor package. The resins are at times filled with some sort of silica filler to reduce the coefficient of thermal expansion to better match that of the lead frame along with small amounts of other additives. An example from above is molding compound 114. "Nonlinear from a top view" or plan view with respect of openings in the metal strip of the leadframe means that as one views the metal strip from above the surface (e.g., like in FIG. 4C) one sees that the openings are substantially curvilinear or containing overall non-linear segments; all the openings from the top view in FIG. 4C are examples.

"Non-linear portions" refers to portions that are other than linear, e.g., curvilinear.

"Photoresist pattern" is a pattern or image that is used to activate portions of a photoresist layer. "Semiconductor die" is the semiconductor chip with a function circuit or device. An example from above is the die 104, FIG. 1. "Semiconductor package" is the semiconductor die after interconnecting with leadframe and being at least partially covered with a molding compound. An example from above is semiconductor package 100. "Opening" means a void or location where material has been removed or not formed.

With respect to the expression "each of the plurality of first bumps including a lateral cross-sectional area larger than a lateral cross-sectional area of each of the second plurality of bumps on a given cross-sectional plane of the semiconductor package," an example is clear from FIG. 4B. An example of a given cross-sectional plane 207 of the semiconductor package is shown in broken lines as it intersects a first bump 209 of the plurality of first bumps and one of the second bumps 211 of the plurality of second bumps. It is apparent that the cross sectional area of the first bump 209 for a lateral cut along plane 207 would be larger than the cross sectional area for a lateral cut along plane 207 of the second bump 211. The cross-sectional area refers to the area of the resultant shape when you make a cut in cross section—e.g. a lateral cut on a longitudinal object; thus, a lateral cross sectional area of a cylinder would be a circle. In one example, the larger first bump 209 is a power bump and the smaller second bump 211 is a signal bump.

With respect to the expression "at least one of the first plurality of bumps overlap," as viewed from an edge or end view, means that when one looks along a lead from an end—like the view of FIG. 4B—one will see bumps that appear to overlap (245 in FIG. 4B). If one lighted the bumps from that angle (along a lead and along a surface of the metal strip) to make a projected silhouette, at least two adjacent bumps (209, 211) would appear in the silhouette as partially merged.

With respect to the expression "cutting a first side of a metal strip to a depth D1 . . . to form a first plurality of openings extending on the first side, wherein the depth D1 is less than a height H of the metal strip," what is meant is that, in one example, the depth of the cut to make the first openings that starts on the first side of the metal strip and moves towards the second side is a distance D1 but that is not all the away through the metal strip, which has a thickness or width or height of H3. H3 is between the first surface and the second surface. The cut from the first side is to a depth of D1 to make the first openings. The second openings are from the second side, and the second openings involve material removed or not formed between the second side in the direction of the first side to a depth of D2. If, as is contemplated, D1+D2=H3, then a complete opening or space through the metal strip has been formed.

Modifications are possible in the described arrangements, and other arrangements are possible, within the scope of the claims.

What is claimed is:

1. A method for forming a semiconductor package, the method comprising:
    cutting a first side of a leadframe of the semiconductor package to a first depth from a first side of the leadframe according to a cutting pattern to form a plurality of first channels, wherein the first depth is less than a thickness of the leadframe;
    etching a second side of the leadframe opposing the first side to form a second plurality of channels to a second depth from the second side, less than the thickness of the leadframe, wherein the etching operation generates openings into the first plurality of channels, the openings separating leads of the leadframe into distinct segments;
    coupling a plurality of bumps of a semiconductor die to the first side of the leadframe; and
    covering at least a portion of the semiconductor die and at least a portion of the leadframe with a molding compound.

2. The method of claim 1, wherein the cutting the first side of the leadframe is performed after the etching the second side of the leadframe.

3. The method of claim 1, wherein the thickness of the metal strip is between the first side and the second side of the metal strip.

4. The method of claim 1, wherein the plurality of bumps is aligned in multiple rows, at least one of the plurality of bumps from at least two adjacent rows of the multiple rows overlap with each other from a side view of the semiconductor package.

5. The method of claim 1, wherein the second depth is more than the first depth.

6. The method of claim 1, wherein the cutting of the first side of the leadframe includes using a laser, a precision water jet, or a plasma cutter.

7. The method of claim 1, wherein the cutting pattern aligns at least partially with a photoresist pattern.

8. The method of claim 1, wherein the etching from the second side continues through 50 to 80 percent of the thickness of the metal strip.

9. The method of claim 1, wherein the cutting of the first side of the leadframe includes forming a cut with a lateral width that is less than 50 microns.

10. The method of claim 1, wherein the cutting pattern is substantially linear.

11. The method of claim 1, wherein the first plurality of openings and the second plurality of openings together separate a plurality of leads of the metal strip.

12. A method comprising:
   forming a leadframe for a semiconductor package, wherein forming the leadframe comprises:
   cutting a first side of a metal strip according to a cutting pattern to form a first plurality of openings extending into the first side, the metal strip having the first side and a second side, wherein the second side opposes the first side, and wherein the metal strip has a height H between the first side and the second side,
   applying a photoresist on the second side of the metal strip,
   applying a chemical etch to the second side of the metal strip according to a photoresist pattern to form a second plurality of openings extending into the second side of the metal strip, wherein the at least a portion of the second plurality of openings align with the first plurality of openings, and wherein a depth D2 of the etching from the second side is less than the height H of the metal strip,
   removing the photoresist from the second side of the metal strip, wherein cutting the first side of the metal strip comprises forming a plurality of leads having a plurality of bump landing sites;
   attaching a plurality of bumps between a semiconductor die and the plurality of bump landing sites on the leadframe; and
   covering at least a portion of the semiconductor die and the leadframe with a molding compound to form the semiconductor package; wherein the plurality of bumps is aligned in multiple rows, at least one of the plurality of bumps from at least two adjacent rows of the multiple rows overlap with each other from a side view of the semiconductor package.

13. The method of claim 12, wherein cutting the first side of the metal strip comprises using a laser.

14. The method of claim 12, wherein cutting the first side of the metal strip comprises using a precision water jet or a plasma cutter.

15. The method of claim 12, wherein the chemical etch is applied until 50 to 80 percent of the height H of the metal strip is removed according to the photoresist pattern.

16. The method of claim 12, wherein cutting the first side of the metal strip includes forming a cut with a lateral width WI that is less than 50 microns.

17. The method of claim 12, wherein cutting the first side of the metal strip includes forming a cut with a lateral width WI that is less than 25 microns.

18. The method of claim 12, wherein the cutting is performed after applying the chemical etch.

19. The method of claim 12, wherein the cutting pattern includes a nonlinear pattern.

20. The method of claim 12, wherein the cutting pattern includes substantially a sinusoidal pattern.

* * * * *